(12) United States Patent
Hongo

(10) Patent No.: US 8,270,157 B2
(45) Date of Patent: Sep. 18, 2012

(54) ELECTRONIC DEVICE

(75) Inventor: Takeshi Hongo, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 170 days.

(21) Appl. No.: 12/893,966

(22) Filed: Sep. 29, 2010

(65) Prior Publication Data

US 2011/0157832 A1 Jun. 30, 2011

(30) Foreign Application Priority Data

Dec. 28, 2009 (JP) ................. 2009-298500

(51) Int. Cl.
H05K 7/20 (2006.01)
(52) U.S. Cl. ............ 361/679.54; 361/679.46; 361/704; 361/709; 361/719; 165/80.3; 165/104.33; 165/185; 174/15.1; 174/16.3; 174/252
(58) Field of Classification Search ......... 361/679.46–679.54, 689, 700–712, 361/719–724; 165/80.3, 80.4, 80.5, 104.33, 165/104.34, 104.21, 185; 174/15.1, 15.2, 174/15.3, 16.3, 252; 257/706–727; 439/73, 439/108, 66, 68–71; 29/842, 854, 602.1, 29/592.1

See application file for complete search history.

(56) References Cited

U.S. PATENT DOCUMENTS

| 5,065,279 | A | * | 11/1991 | Lazenby et al. | ............... 361/720 |
| 5,267,867 | A | * | 12/1993 | Agahdel et al. | ................. 439/73 |
| 5,986,887 | A | | 11/1999 | Smith et al. | |
| 6,219,243 | B1 | * | 4/2001 | Ma et al. | ....................... 361/704 |
| 6,442,026 | B2 | * | 8/2002 | Yamaoka | ...................... 361/704 |
| 6,490,161 | B1 | * | 12/2002 | Johnson | ........................ 361/704 |
| 6,580,611 | B1 | * | 6/2003 | Vandentop et al. | ........... 361/704 |
| 6,816,375 | B2 | * | 11/2004 | Kalyandurg | ................... 361/704 |
| 7,268,425 | B2 | * | 9/2007 | Mallik et al. | .................. 257/706 |
| 7,428,154 | B2 | * | 9/2008 | Ishimine et al. | .............. 361/704 |
| 7,595,993 | B2 | * | 9/2009 | Mitsui et al. | .................. 361/719 |
| 7,674,985 | B2 | | 3/2010 | Kaji | |
| 7,782,621 | B2 | | 8/2010 | Matsushiba et al. | |
| 7,983,048 | B2 | * | 7/2011 | Sasaki et al. | .................. 361/719 |

(Continued)

FOREIGN PATENT DOCUMENTS

JP 58-007396 1/1983

(Continued)

OTHER PUBLICATIONS

Japanese Patent Application No. 2009-298500; Notice of Reasons for Rejection; Mailed Jan. 18, 2011 (English translation).

(Continued)

Primary Examiner — Michail V Datskovskiy
(74) Attorney, Agent, or Firm — Blakely, Sokoloff, Taylor & Zafman LLP

(57) ABSTRACT

According to one embodiment, the electronic device includes: a heating element that has: a first electronic part; and a plurality of connection terminals provided around the first electronic part; a first circuit board that has: a first surface; a second surface opposite to the first surface; an opening; and a plurality of pads provided around the opening at the first surface to be electrically connected with the connection terminals, respectively; a heat receiving member that has a heat receiving portion faced to the heating element and that is thermally connected to the heating element; a pressing member that presses the heat receiving member toward the first circuit board; and a support member that supports the first circuit board at a periphery of the opening from the second surface.

7 Claims, 11 Drawing Sheets

U.S. PATENT DOCUMENTS

2005/0265001 A1* 12/2005 Saito .................. 361/710
2008/0296047 A1   12/2008 Kaji

FOREIGN PATENT DOCUMENTS

| | | |
|---|---|---|
| JP | 4-304659 | 10/1992 |
| JP | 05-315712 | 11/1993 |
| JP | 07-231053 | 8/1995 |
| JP | 08-222671 | 8/1996 |
| JP | 2000-332473 | 11/2000 |
| JP | 2002528922 | 9/2002 |
| JP | 2003-110258 | 4/2003 |
| JP | 2008-294348 | 12/2008 |
| JP | 2009117612 | 5/2009 |
| WO | WO 0025562 | 5/2000 |

OTHER PUBLICATIONS

Japanese Patent Application No. 2009-298500; Notice of Reasons for Rejection; Mailed Apr. 12, 2011 (English translation).

Japanese Patent Application No. 2009-298500; Notice of Reasons for Rejection; Mailed Jun. 14, 2011 (English translation).

* cited by examiner

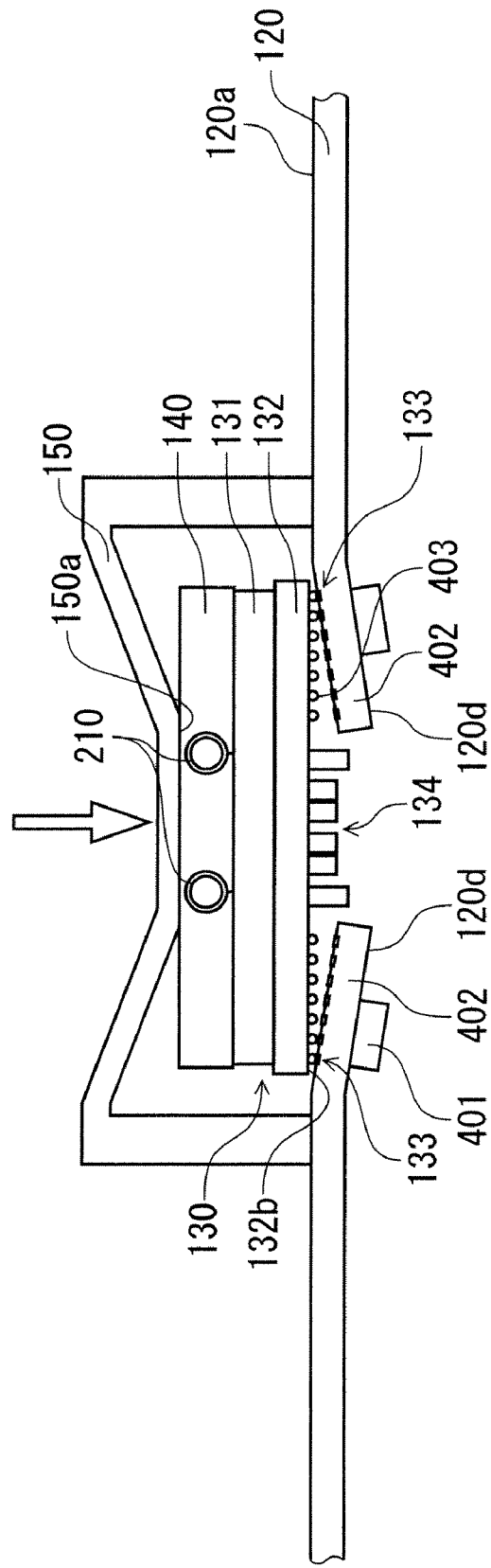

ELECTRONIC DEVICE

CROSS-REFERENCE TO RELATED APPLICATION(S)

This application is based upon and claims the benefit of priority from Japanese Patent Application No. 2009-298500, filed on Dec. 28, 2009, the entire contents of which are incorporated herein by reference.

FIELD

Embodiments described herein relate generally to an electronic device.

BACKGROUND

Generally, an electronic part such as a semiconductor package is mounted on a circuit board by a ball grid array (BGA) or the like. When such electronic part largely generates a heat, a heat radiating member such as a heat receiving block is pressingly abutted on the electronic part so that the electronic part is cooled through the heat radiating member. In this case, since the pressure from the heat radiating member is applied not only to the electronic part but also to the circuit board, the circuit board may be bent, and the electronic part may come off the circuit board.

There is a technology of preventing the bend of the circuit board by providing a reinforcing bracket that abuts on the circuit board (for example, JP-2003-110258-A). In JP-2003-110258-A, the bend of the circuit board and the coming off of an electronic part from the circuit board are prevented by providing a reinforcing bracket. The reinforcing bracket is fixed to a chassis of a personal computer while abutting on the rear surface of the circuit board, thereby supporting the circuit board and so as not to be bent by a load applied to the circuit board.

Sometimes, an opening may be provided in a circuit board where an electronic part is mounted. For example, a convex portion higher than the BGA may be present on the substrate side of an electronic part, and in order to prevent the convex portion from abutting on the circuit board, an opening is provided in the circuit board. Since strength of a circuit board around such opening is weak so as to be easily bent by a pressure from the heat radiating member, it is necessary to reinforce around the opening of the circuit board. However, in JP-2003-110258-A, no consideration is taken for an opening in the circuit board and for the bend of the circuit board around the opening.

BRIEF DESCRIPTION OF THE DRAWINGS

A general architecture that implements the various feature of the present invention will now be described with reference to the drawings. The drawings and the associated descriptions are provided to illustrate embodiments of the present invention and not to limit the scope of the present invention.

FIG. 5 illustrates a longitudinal cross section of a comparison-example mounting structure.

DETAILED DESCRIPTION

In general, according to one embodiment, the electronic device includes: a heating element that has: a first electronic part; and a plurality of connection terminals provided around the first electronic part; a first circuit board that has: a first surface; a second surface opposite to the first surface; an opening; and a plurality of pads provided around the opening at the first surface to be electrically connected with the connection terminals, respectively; a heat receiving member that has a heat receiving portion faced to the heating element and that is thermally connected to the heating element; a pressing member that presses the heat receiving member toward the first circuit board; and a support member that supports the first circuit board at a periphery of the opening from the second surface.

Hereinafter, embodiments will be described with reference to the drawings.

Figure 1:
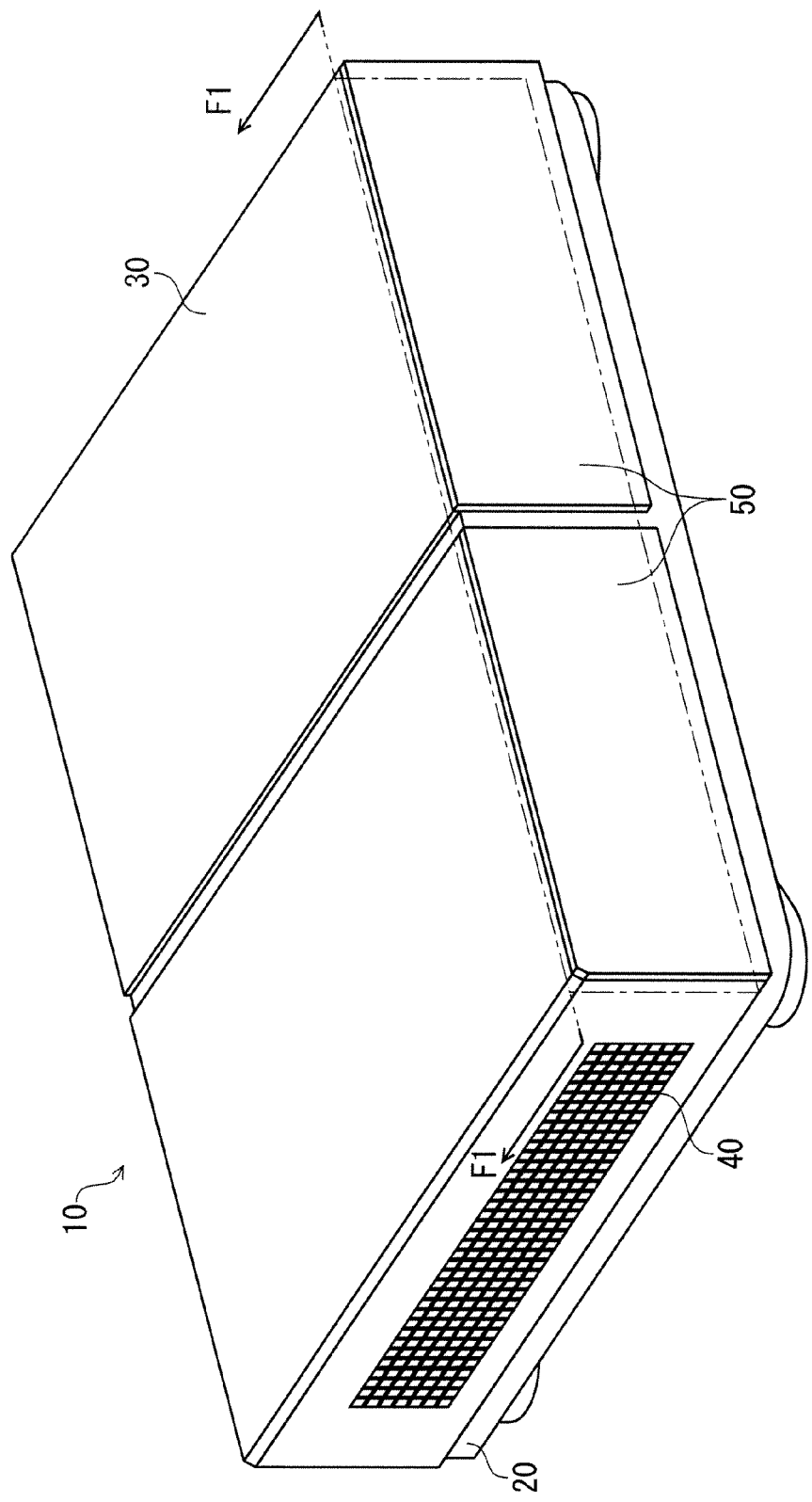
FIG. 1 illustrates an electronic device according to an embodiment.

FIG. 1 illustrates an electronic device according to the embodiment. A receiver 10 for receiving a television broadcast is exemplified as the electronic device. The receiver 10 includes: a cabinet 20; an ornamental cover 30 that covers the cabinet 20; a ventilation hole 40 for exhausting air from the cabinet or aspirating air outside the cabinet; and a front door 50 that covers the front surface of the ornamental cover 30. The receiver 10 includes a semiconductor package configured to implement, for example, the function of receiving various kinds of television programs, the function of simultaneously recording more than one television program and the function of recording long-time programs. In the embodiment, a circuit board on which a semiconductor package is mounted is prevented from being bent. Details thereof will be described later with reference to FIGS. 4 to 11.

Figure 2:
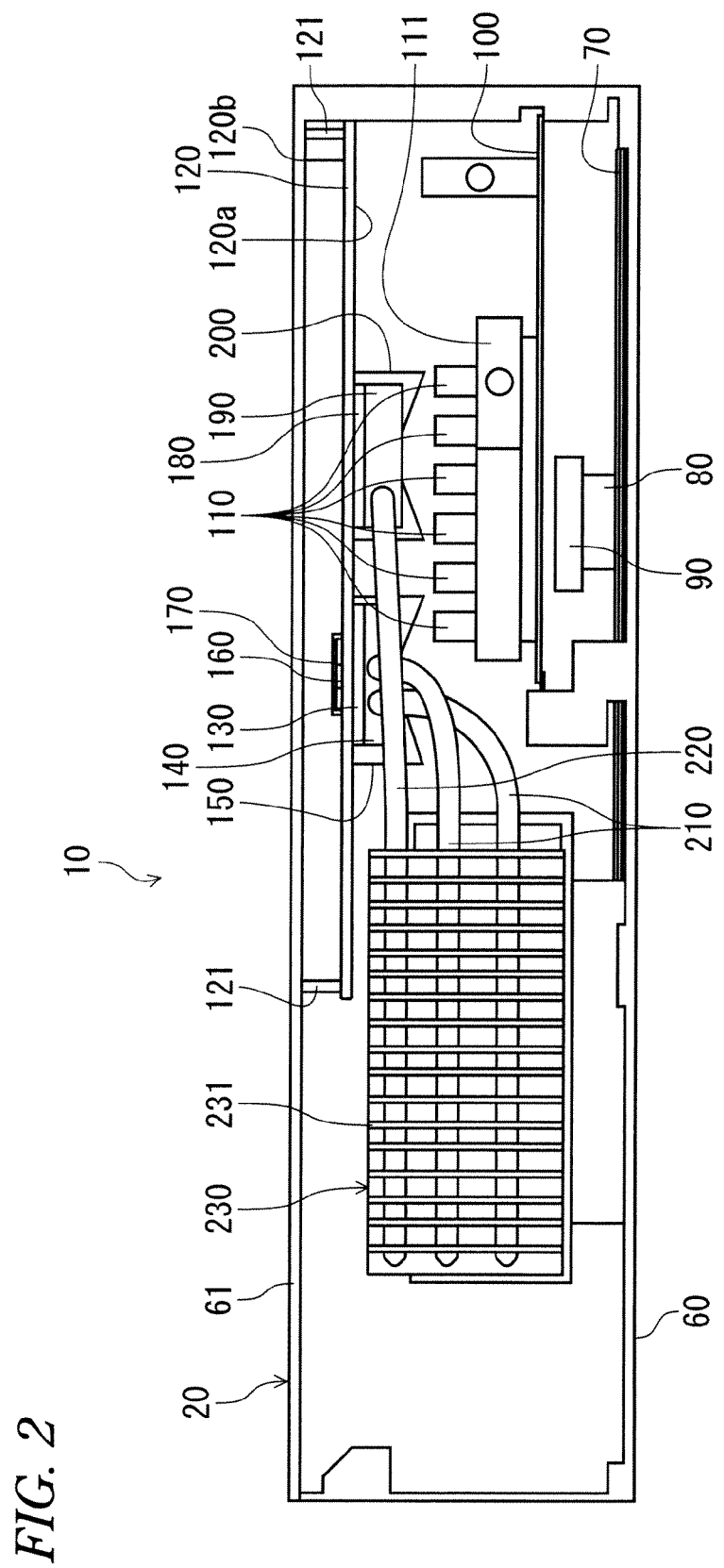
FIG. 2 illustrates the internal structure of the electronic device according to the embodiment.

Next, the structure of the receiver 10 will be described with reference to FIG. 2. FIG. 2 illustrates the structure of the receiver 10 viewed from a cross section taken along line F1-F1 in FIG. 1.

The receiver 10 includes the cabinet 20, a bottom plate 60, a top plate 61 and the like. The receiver 10 also includes the following inside the cabinet 20: an image processing board 70; an image processing chip 80; a heat sink 90; a tuner board 100; tuner modules 110; a distributor 111; a main board 120; a connection member 121; a main processor 130; a first heat receiving block 140; a first pressing member 150; a support member 160; a plate member 170; an I/O controller 180; a second heat receiving block 190; a second pressing member 200; first heat pipes 210; a second heat pipe 220; a heat sink 230 and the like.

The image processing board 70 is for mounting an electronic part related to image processing, and is horizontally placed above the bottom plate 60. For example, the image processing chip 80 and the like for processing images are mounted on the image processing board 70, and the heat sink 90 for cooling the image processing chip 80 is attached to the image processing chip 80.

The tuner board 100 is for mounting an electronic part related to television broadcast reception, and is horizontally placed above the image processing board 70. Plural tuner modules 110 that receive television broadcast signals, the distributor 111 connected to the tuner modules 110, and the like are mounted on the tuner board 100.

The main board 120 is for mounting the main processor 130 and the like. The main board 120 is situated above the tuner board 100, and is horizontally attached to the cabinet 20 by the connection member 121. The main board 120 has a surface 120a faced to the tuner board 100, a surface 120b faced to the top plate 61 of the cabinet 20, and an opening 120c (not shown in FIG. 2) passing through from the surface 121a to the surface 120b. Pads 122 (not shown in FIG. 2) for connecting a ball grid array 133 of the main processor 130 are provided on the surface 120a of the main board 120.

Plural electronic parts such as the main processor 130, the first pressing member 150, the I/O controller 180, the second pressing member 200 and a non-illustrated capacitor and memory are mounted on the surface 120a of the main board 120. On the other hand, the support member 160, the plate member 170 and plural non-illustrated electronic parts are attached to the surface 120b opposite to the surface 120a.

The main processor 130 is, for example, a semiconductor package that performs image processing, and is mounted to cover the opening 120c (not shown in FIG. 2) of the main board 120 by a BGA or the like. The main processor 130 is a heating element that generates heat during the operation, and the heat generated during the operation is radiated through the first heat receiving block 140, the heat pipes 210 and the like.

The first heat receiving block 140 abuts on the main processor 130 to receive the heat generated therefrom. For example, a high-thermal-conductivity material such as copper and aluminum may be used for the first heat receiving block 140. The first heat receiving block 140 has holes (not shown) for thermally connecting the first heat pipes 210, and radiates the heat received from the main processor 130 to the first heat pipes 210 through the holes.

While the main processor 130 and the first heat pipes 210 are thermally connected through the first heat receiving block 140 in this embodiment, the receiver 10 may have no first heat receiving block 140. For example, a flat heat pipe may be thermally connected to the main processor 130, and the first pressing member 150 may presses the heat pipe. By thus directly connecting the heat pipe to the main processor 130 without the first heat receiving block 140, a space in the cabinet 20 can be increased.

The first pressing member 150 is a pressure bar spring attached to the main board 120, and presses the first heat receiving block 140 against the main processor 130.

The support member 160 supports the main board 120 at an opening periphery 120d (not shown in FIG. 2) of the opening 120c (not shown in FIG. 2). For example, the support member 160 may be formed of a metal or a plastic.

The plate member 170 is attached to the main board 120 for supporting the support member 160. For example, the plate member 170 may be a metallic back plate or a circuit board.

The I/O controller 180 is mounted on the main board 120, for example, by a BGA.

For example, a high-thermal-conductivity material such as copper or aluminum may be used for the second heat receiving block 190. The second heat receiving block 190 abuts on the I/O controller 180 to receive the heat generated therefrom. The second heat receiving block 190 has a hole for thermally connecting the second heat pipe 220, and radiates the heat received from the I/O controller 180 to the second heat pipe 220 through the hole.

The second pressing member 200 is a pressure bar spring attached to the main board 120, and presses the second heat receiving block 190 against the I/O controller 180.

The first heat pipes 210 of heat transmission pipes are thermally connected to the first heat receiving block 140 to receive the heat thereof and to transmit the received heat to the heat sink 230. The second heat pipe 220 of a heat transmission pipe is thermally connected to the second heat receiving block 190 to receive the heat thereof and to transmit the received heat to the heat sink 230.

The heat sink 230 receives and radiates the heat transmitted from the first heat pipes 210 and the second heat pipe 220. The heat sink 230 has radiating fins 231 disposed parallel to one another at intervals. The heat sink 230 is thermally connected to the first heat pipes 210 and the second heat pipe 220 to radiate the heat received therefrom, through the radiating fins 231.

Figure 3:
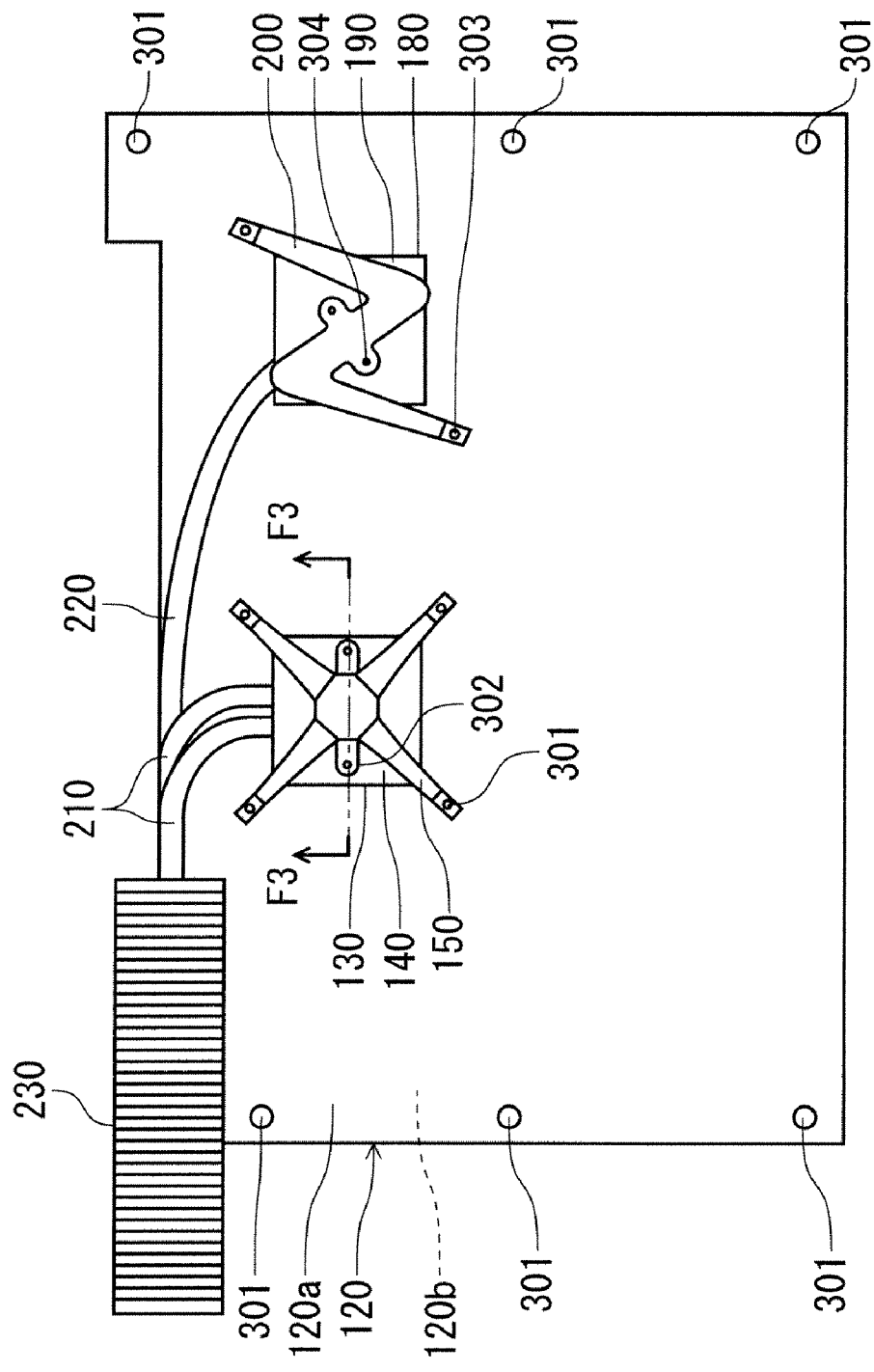
FIG. 3 illustrates a main board and components mounted thereon according to the embodiment.

Next, the main board 120, components mounted on the main board 120, and the like will be described with reference to FIG. 3. FIG. 3 illustrates the main board 120 and the like viewed from the surface 120a side.

The main board 120 has holes 301 for attaching the connection member 121 (not shown in FIG. 3). As described previously with reference to FIG. 2, the main processor 130, the first pressing member 150, the I/O controller 180, the second pressing member 200 and the like are mounted on the surface 120a of the main board 120. The support member 160 (not shown in FIG. 3) and the plate member 170 (not shown in FIG. 3) are present on the surface 120b opposite to the surface 120a of the main board 120. The support member 160 supports the opening 120c (not shown in FIG. 3) covered by the main processor 130, from the opposite side of the main processor 130.

The cross-shaped first pressing member 150 has holes 301 for connecting the first pressing member 150 to the main board 120 by a grommet or the like and holes 302 for connecting the pressing member 150 to the first heat receiving block 140 by a grommet or the like.

The N-shaped second pressing member 200 has holes 303 for attaching the second pressing member 200 to the main board 120 and holes 304 for connecting the second pressing member 200 to the second heat receiving block 190.

Figure 4:
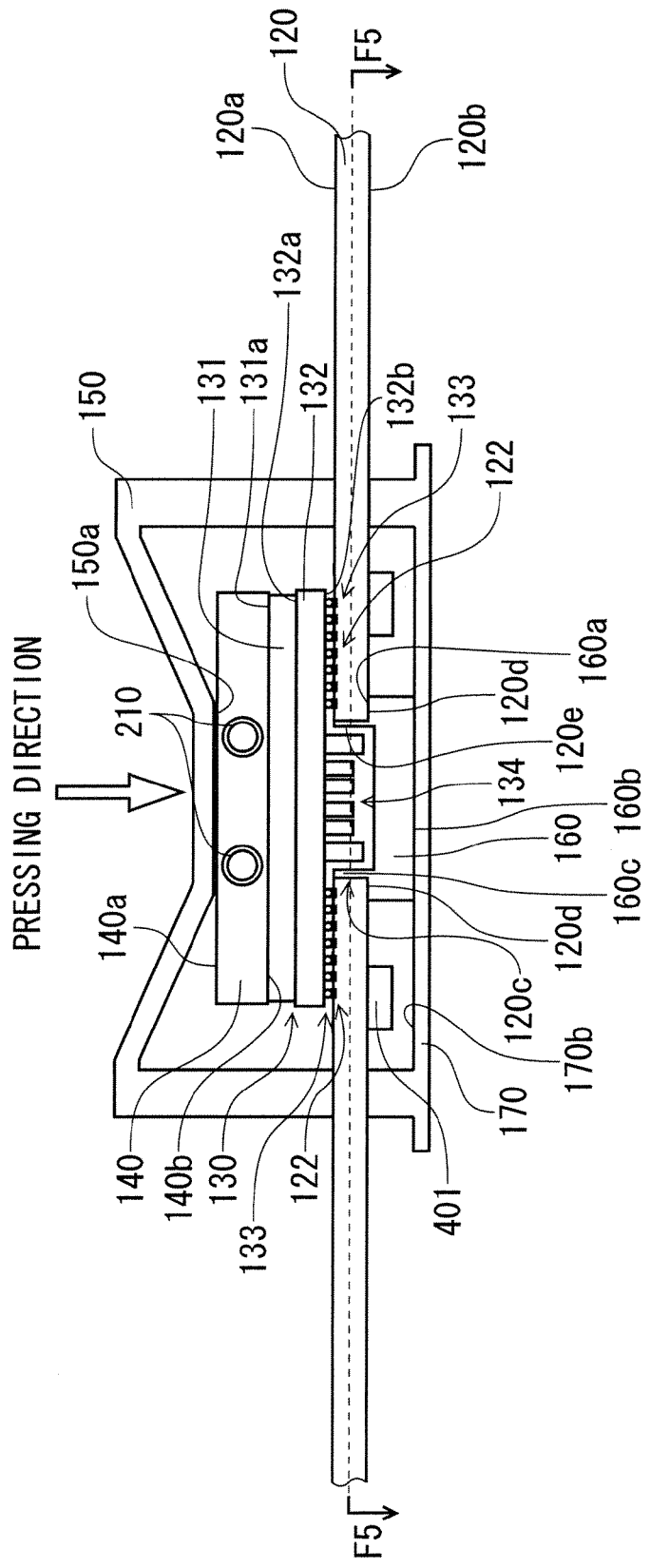
FIG. 4 illustrates a longitudinal cross section of a mounting structure according to the embodiment.

Next, a mounting structure according to the present embodiment will be described with reference to FIG. 4. FIG. 4 illustrates a longitudinal cross-sectional view taken along line F3-F3 in FIG. 3.

The main board 120 has: the surface 120a; the surface 120b; the opening 120c; the opening periphery 120d which is the periphery of the opening 120c; an opening inner peripheral surface 120e which is the inner peripheral surface of the opening 120c and the like. Here, the periphery of the opening indicates a peripheral area around the opening 120c of the surface 120b. On the surface 120a, the pads 122 for electrically connecting the ball grid array 133 of the main processor 130 are provided around the opening 120c.

First, a structure mounted on the surface 120a of the main board 120 will be described. The main processor 130 is mounted on the surface 120a of the main board 120 through the pads 122. The main processor 130 has a semiconductor element 131, a processor board 132, the ball grid array 133 and an electronic part 134.

The semiconductor element 131 is, for example, a semiconductor element that performs image processing and the like, and is mounted on a surface 132a of the processor board 132. The electronic part 134 is, for example, at least one electronic part such as a capacitor or a resistor, and is mounted on a surface 132b opposite to the surface 132a of the processor board 132.

The ball grid array 133 is a connection member such as plural solder balls provided around the electronic part 134 on the surface 132b of the processor board 132, and electrically connects the main processor 130 and the main board 120 by connecting the surface 132b of the processor board 132 and the pads 122 on the surface 120a of the main board 120 by soldering.

When the electronic part 134 is higher than the ball grid array 133, the electronic part 134 and the main board 120 abut on each other. Even when the electronic part 134 is lower than the ball grid array 133, if the processor board 132 is distorted toward the main board 120 by the pressing force from the first pressing member 150, the electronic part 134 might abut on the main board 120. Accordingly, in the electronic device according to the present embodiment, the electronic part 134 and the main board 120 are prevented from abutting on each other by mounting the main processor 130 so that at least part of the electronic part 134 is situated in the opening 120c of the main board 120 or that the electronic part 134 is faced to the opening 120c of the main board 120.

The first heat receiving block 140 is situated between the semiconductor element 131 and the first pressing member 150, and has a surface 140a and a surface 140b opposite to the surface 140a. The surface 140b of the first heat receiving block 140 is pressed against the surface 131a of the semiconductor element 131 by the pressing force from the first pressing member 150. The first heat pipes 210 pass through the first heat receiving block 140.

The first pressing member 150 is attached to the main board 120 so that a surface 150a of the first pressing member 150 and the surface 140a of the first heat receiving block 140 are in contact with each other. The first pressing member 150 presses the first heat receiving block 140 toward the semiconductor element 131. Thereby, the surface 140b of the first heat receiving block 140 is pressed against the surface 131a of the semiconductor element 131, so that the semiconductor element 131 and the first heat receiving block 140 are electrically connected.

Next, a structure on the surface 120b of the main board 120 will be described. The support member 160, the plate member 170, an electronic part 401 and the like are attached to the surface 120b of the main board 120.

The support member 160 has a support surface 160a, a plate member abutting surface 160b and a convex portion 160c, and covers the opening 120c of the main board 120. The support surface 160a supports the main board 120 at the opening periphery 120d. The plate member abutting surface 160b is in contact with the plate member 170. The convex portion 160c is fitted in the opening 120c of the main board 120, so that the support member 160 can be prevented from being shifted in a direction parallel to the main board 120. Details of the support member 160 will be described with reference to FIGS. 6A to 8.

The plate member 170 is attached to the main board 120. A surface 170b of the plate member 170 abuts on the plate member abutting surface 160b of the support member 160, whereby the plate member 170 supports the support member 160.

Next, a board structure of the electronic device when there is no member supporting the neighborhood (the opening periphery 120d) of the opening 120c of the main board 120 will be described with reference to FIG. 5. FIG. 5 illustrates a longitudinal cross section of the comparison-example board structure of the electronic device in which no supporting member for the opening periphery 120d is provided.

The first pressing member 150 presses the first heat receiving block 140 against the semiconductor element 131. As a result, the main board 120 receives a pressure from the surface 132b of the processor board 132 and the ball grid array 133. However, in the structure of FIG. 5, since there is no member supporting the board 120 at the opening periphery 120d, an opening neighborhood 402 of the board 120 is bent by the pressure, and by the bend of the opening neighborhood 402, a ball grid array 403 and the like around the opening can come off the main board 120.

On the other hand, in the electronic device described in FIG. 4 and other figures, the support member 160 supports the opening periphery 120d of the main board 120 to thereby prevent the opening neighborhood 402 of the main board 120 from being bent by the pressing force from the first pressing member 150.

Next, the support member 160 and the plate member 170 will be described with reference to FIGS. 6A and 6S.

Figure 6A:
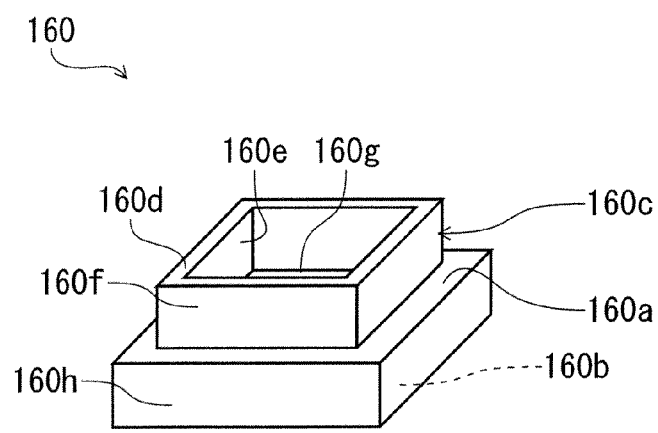
FIGS. 6A and 6B illustrate a support member according to the present embodiment.

The support member 160 is illustrated in FIG. 6A. The support member 160 has the support surface 160a, the plate member abutting surface 160b, the convex portion 160c, a convex portion end surface 160d, an inner peripheral surface 160e, a first outer peripheral surface 160f, a concave portion bottom surface 160g, a second outer peripheral surface 160h and the like.

Here, the support surface 160a is a surface abutting on the opening periphery 120d of the main board 120, the plate member abutting surface 160b is a surface abutting on the surface 170b of the plate member 170, and the convex portion 160c is a part fitted in the opening 120c of the main board 120. The convex portion end surface 160d is the end surface of the convex portion 160c, the inner peripheral surface 160e is the inner peripheral surface of the convex portion 160c, the first outer peripheral surface 160f is the outer peripheral surface of the convex portion 160c, the concave portion bottom surface 160g is the bottom surface of the concave portion surrounded by the convex portion 160c which bottom surface is faced to the electronic part 134 and the like, and the second outer peripheral surface 160h is a surface uprising with respect to the plate member abutting surface 160b.

Figure 6B:
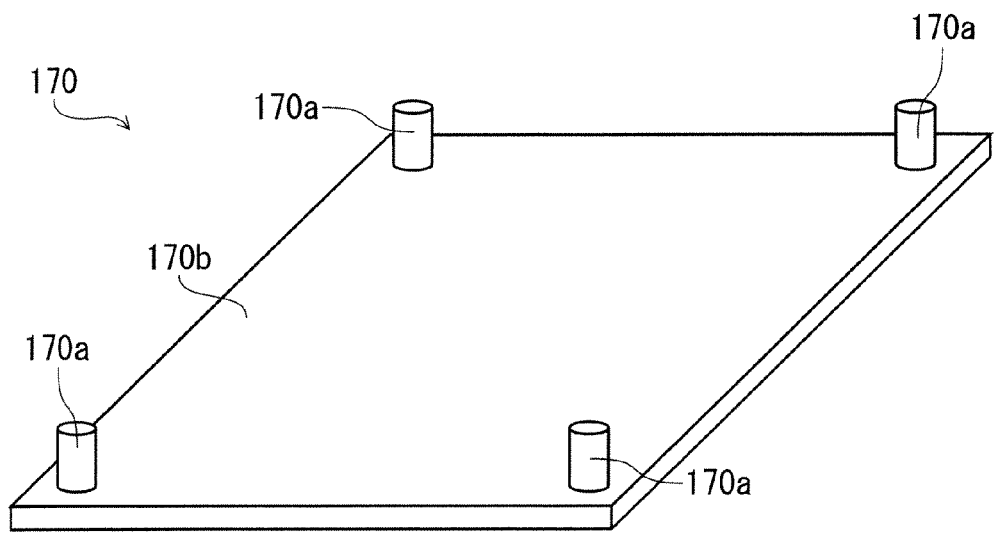

The plate member 170 is illustrated in FIG. 6B. The plate member 170 has a connection portion 170a, the surface 170b and the like. The connection portion 170a connects the plate member 170 and the main board 120. The surface 170b is faced to the surface 120b of the main board 120.

Figure 7A:
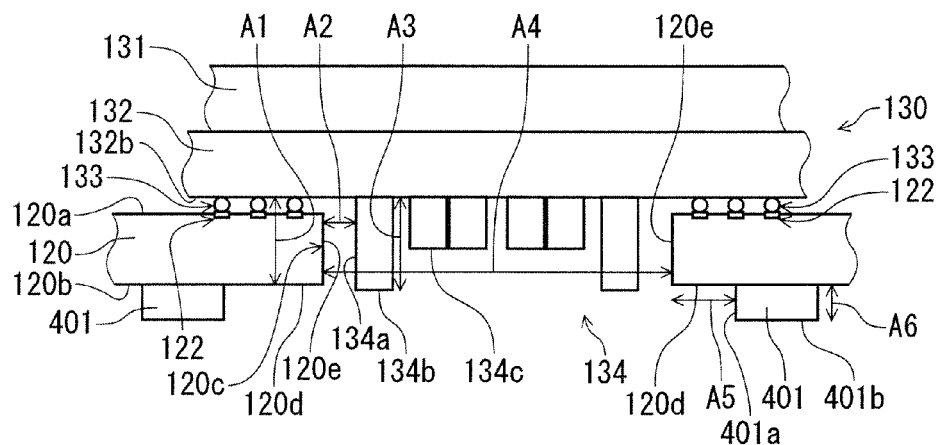
FIGS. 7A to 7C illustrate longitudinal cross sections of the mounting structure according to the embodiment.
Figure 7B:
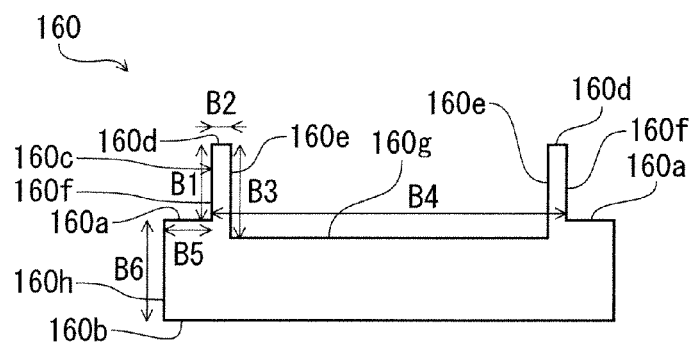
Figure 7C:
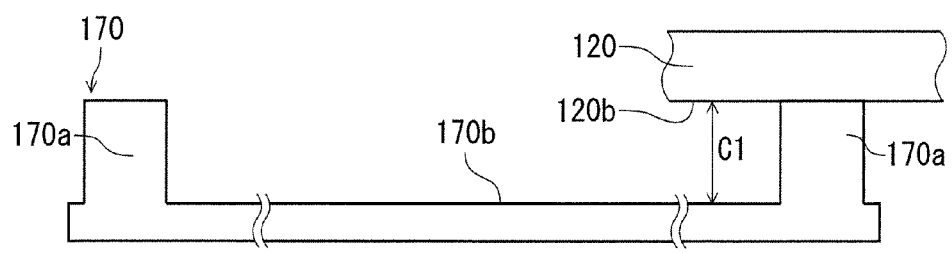
Figure 8:
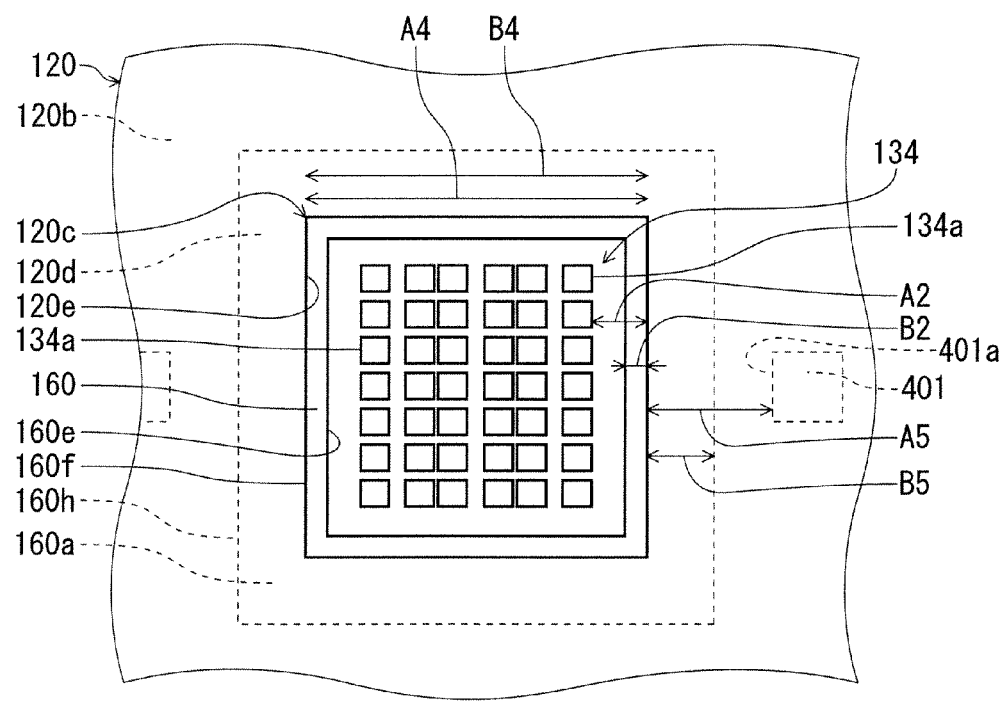
FIG. 8 illustrates a horizontal cross section of the mounting structure according to the present embodiment.

Next, the positional relationship among components such as the main board 120, the main processor 130, the support member 160 and the plate member 170 will be described with reference to FIGS. 7A to 7C and 8. FIGS. 7A to 7C illustrate the main board 120, the main processor 130, the support member 160, the plate member 170 and the like on a cross section taken along line F3-F3 of FIG. 3. FIG. 8 illustrates a horizontal cross-sectional view taken along line F5-F5 in FIG. 4.

Here, A1 to A6, B1 to B6 and C1 represent the width, height, distance and the like of and between components such as the main board 120, the main processor 130, the support member 160 and the plate member 170 on the cross section taken along line F3-F3 in FIG. 3.

Specifically, A1 represents the distance between the surface 132b of the processor board 132 and the surface 120b of the main board 120, A2 represents the width of the gap between the opening inner peripheral surface 120e of the main board 120 and a side surface 134a of the outermost electronic part 134, A3 represents the height of the highest electronic part 134, A4 represents the width of the opening 120c of the main board 120, A5 represents the distance between a side surface 401a of the electronic part 401 and the opening inner peripheral surface 120e of the main board 120, and A6 represents the height of the electronic part 401.

Regarding the support member 160, B1 represents the height from the convex portion end surface 160d to the support surface 160a, B2 represents the width of the convex portion end surface 160d between the first outer peripheral surface 160f and the inner peripheral surface 160e, B3 represents the height of the inner peripheral surface 160e from the convex portion end surface 160d to the concave portion bottom surface 160g, B4 represents the length of one side of the first outer peripheral surface 160f, B5 represents the width of the support surface 160a between the first outer peripheral surface 160f and the second outer peripheral surface 160h, and B6 represents the height between the support surface 160a and the plate member abutting surface 160b. Regarding the plate member 170, C1 represents the height between the surface 170b and the surface 120b of the main board 120.

It is desirable that the surface 132b of the processor board 132 and the convex portion end surface 160d of the support member 160 be not in contact with each other, that is, B1 be shorter than A1. This is in order to prevent a damage or the like of the processor board 132 due to the abutment of the support member 160 on the processor board 132.

Regarding the electronic part 134 and the support member 160, it is desirable that the side surface 134a and the inner peripheral surface 160e be not in contact with each other and the surface 134b and the concave portion bottom surface 160g be not in contact with each other, either, that is, A2 be longer than B2. This is in order to prevent a damage or the like of the electronic part 134 due to the abutment of the support member 160 on the electronic part 134. Alternatively, the support member 160 may be brought into contact with the electronic part 134 so as not to apply a pressure that damages the electronic part 134. In this case, B2 and A2 substantially coincide with each other, and the concave portion bottom surface 160g and the surface 134b substantially coincide with each other.

Moreover, as shown in FIG. 8, it is desirable that A4 and B4 substantially coincide with each other and the first outer peripheral surface 160f of the support member 160 be in contact with the opening inner peripheral surface 120e of the main board 120. By this contact between the first outer peripheral surface 160f and the opening inner peripheral surface 120e, the support member 160 can be prevented from being shifted in the direction parallel to the main board 120.

Moreover, as shown in FIG. 8, it is desirable that A5 be longer than B5 and the support member 160 and the electronic part 401 do not abut on each other. This is in order to prevent the electronic part 401 from being damaged by the abutment of the support member 160.

Since the electronic part 401 can be damaged by the plate member 170 if the plate member 170 and the electronic part 401 are in contact with each other, it is desirable that C1 be longer than A6.

While the plane cross section of the opening 120c may be a rectangle or a circle, in this case, the support member 160 may be arranged to be in contact with neither the electronic part 134 nor the electronic part 401, but to be in contact with the opening inner peripheral surface 120e.

As described above, the support member 160 is capable of supporting the opening 120c of the main board 120 at the opening periphery 120d without abutting on the main processor 130 having the electronic part 134, the electronic part 401 and the like.

According to the present embodiment, in the receiver 10, the main board 120 having the opening 120c can be supported at the opening periphery 120d, and the opening neighborhood 402 of the main board 120 can be prevented from being bent by the pressing force from the first pressing member 150. Additionally, in the receiver 10, the ball grid array 133 can be prevented from coming off the main board 120 or the processor board 132 by the bend of the opening neighborhood 402.

Moreover, in the receiver 10, by the contact of the convex portion 160a of the support member 160 with the opening inner peripheral surface 120e, the support member 160 can be prevented from being shifted in the direction parallel to the main board 120.

Further, in the receiver 10, the main board 120 can be supported at the opening periphery 120d without abutting on the electronic part 134 situated in the opening 120c, and even when an electronic part such as the electronic part 401 is further mounted on the surface 120b of the main board 120, the main board 120 can be supported without being in contact with these electronic parts.

Second Embodiment

Next, a second embodiment will be described with reference to FIGS. 9A to 9C and 10A to 10C. In an electronic device according to the second embodiment, the opening periphery 120d of the main board 120 is supported by a support member 161 or a support member 162. Since the structures other than the support member 161 and the support member 162 are similar to those of the first embodiment, descriptions thereof are omitted.

Figure 9A:
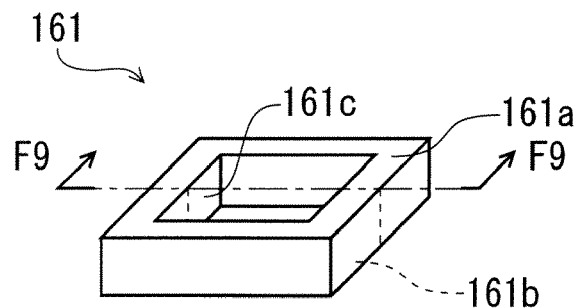
FIGS. 9A to 9C illustrate a support member according to a second embodiment.
Figure 9B:
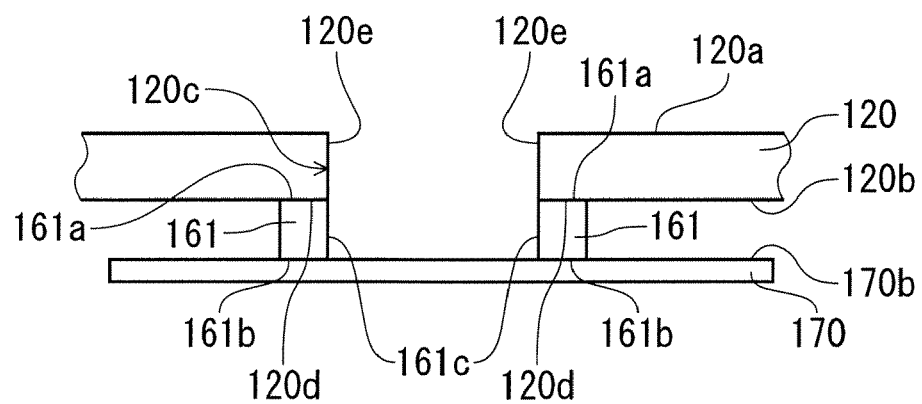
Figure 9C:
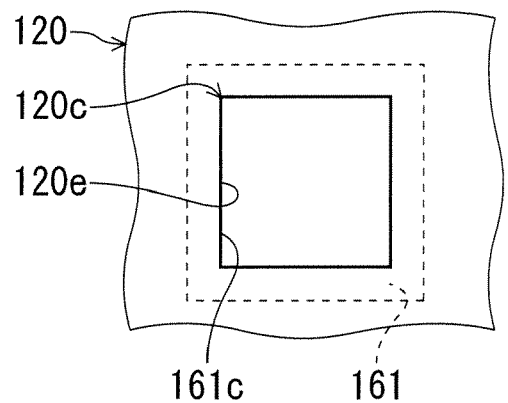

FIGS. 9A to 9C illustrate the support member 161 according to the second embodiment. FIG. 9A illustrates a perspective view of the support member 161. FIG. 9B illustrates a cross-sectional view taken on line F9-F9 in FIG. 9A. FIG. 9C illustrates the main board 120 and the support member 161 viewed from the surface 120a side. The support member 161 supports the main board 120 like the support member 160 of the first embodiment, at the entire part (entire periphery) of the opening periphery 120d.

The frame-shaped support member 161 has a support surface 161a, a surface 161b and an inner peripheral surface 161c.

As shown in FIGS. 9B and 9C, the support surface 161a supports the main board 120 at the entire part of the opening periphery 120d.

As shown in FIG. 9B, the surface 161b is in contact with the surface 170b of the plate member 170, and is supported by the plate member 170. The plate member 170 is attached to the main board 120, the cabinet 20 and the like by a non-illustrated connection member.

The frame-shaped support member 161 has the inner peripheral surface 161c. While the inner peripheral surface 161c of the support member 161 and the opening inner peripheral surface 120e of the main board 120 coincide with each other in FIGS. 9B and 9C, these do not necessarily coincide with each other. That is, for example, in FIG. 9C, the inner peripheral surface 161c of the support member 161 may be situated on the opening center side (inside) of the opening inner peripheral surface 120e or may be situated on the opening periphery side (outside) thereof. However, the support strength can be made higher when the position of the opening inner peripheral surface 120e and the position of the inner peripheral surface 161c of the support member 161 coincide with each other in the horizontal direction or when the position of the inner peripheral surface 161c of the support member 161 is situated on the opening periphery side of the opening inner peripheral surface 120e.

Figure 10A:
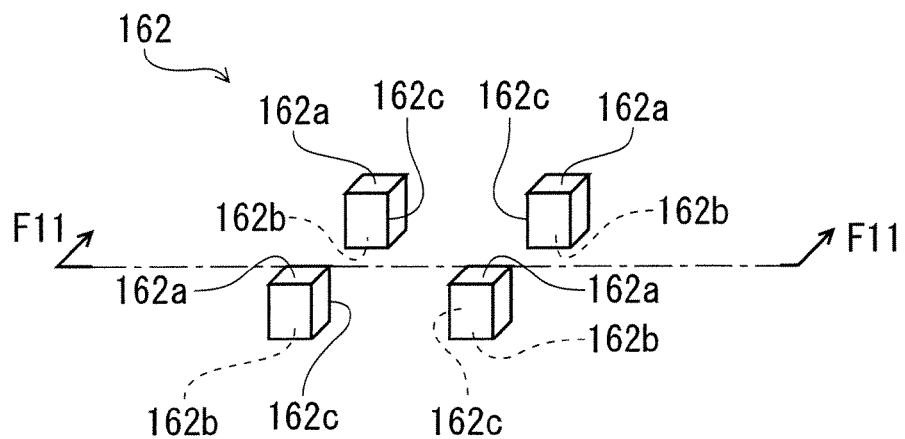
FIGS. 10A to 10C illustrate a support member according to the second embodiment.
Figure 10B:
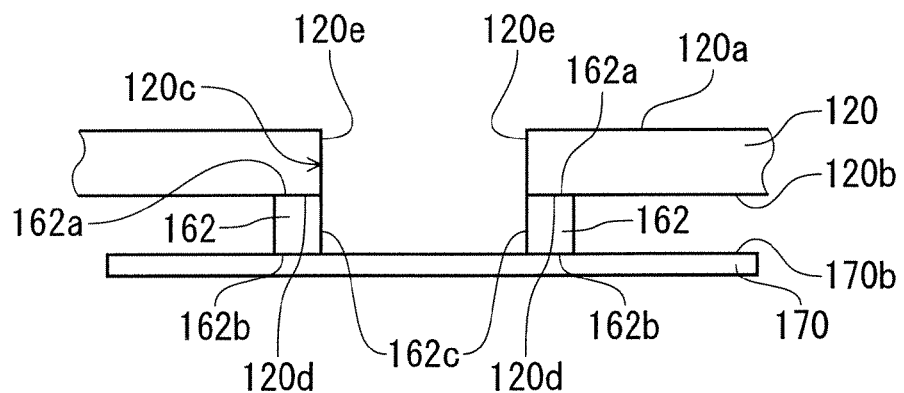
Figure 10C:
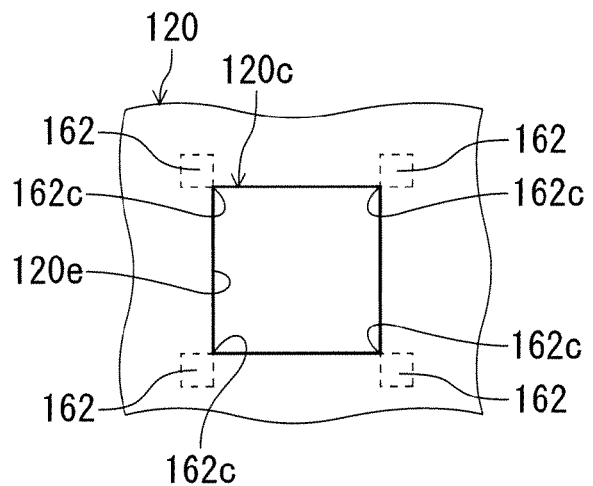

Subsequently, the support member 162 will be described with reference to FIGS. 10A to 10C. FIG. 10A illustrates a perspective view of the support member 162. FIG. 10B illustrates a cross-sectional view taken line F11-F11 in FIG. 10A. FIG. 10C illustrates the main board 120 and the support member 162 viewed from the surface 120a side. The support member 162 supports the main board 120 like the support member 160 in the first embodiment, at a part of the opening periphery 120d (part of the periphery).

The support member 162 has four rectangular columns each having a support surface 162a, a surface 162b and side surfaces 162c.

As shown in FIGS. 10B and 10C, the support surface 162a supports the main board 120 at part of the opening periphery 120d.

The surface 162b is in contact with the surface 170b of the plate member 170, and is supported by the plate member 170.

Of the sides uprising with respect to the support surface 162a, the side surface 162c is the closest to the opening 120c. While the side surfaces 162c and the angular parts of the opening inner peripheral surface 120e coincide with each other in FIG. 10B, they do not necessarily coincide with each other. For example, in FIG. 10C, the side surfaces 162c of the support member 162 may be situated on the opening center side (inside) of the opening inner peripheral surface 120e or on the opening periphery side (outside) thereof. For example, the support strength can be made higher when the horizontal position of the side surfaces 162c coincides with that of the opening inner peripheral surface 120e or when the side surfaces 162c are situated on the opening periphery side of the opening inner peripheral surface 120e.

The support member 162 is not necessarily a rectangular column but may be, for example, a cylinder. While the support member 162 is disposed at each of the four vertices of the rectangular opening 120c in FIG. 10C, the member that supports the opening 120c may be disposed in an arbitrary position as long as it can support part of the opening periphery 120d; for example, it may be disposed in the center of the sides of the rectangular opening 120c. By thus disposing the support member in an arbitrary position of the opening periphery 120d, for example, when an electronic part is mounted on part of the opening periphery 120d of the surface 120b, abutment on the electronic part can be avoided. The support member 162 does not necessarily support the opening periphery 120d at four positions but may support it, for example, at one position. By thus supporting the opening periphery 120d at a small number of positions, the area of the surface 120b of the main board 120 covered by the support member can be reduced, so that a larger number of electronic parts can be mounted on the surface 120b.

On the other hand, by supporting the opening periphery 120d at plural symmetrical positions as in the example of FIGS. 10A to 10C, the support strength can be enhanced.

According to the present embodiment, in the receiver 10, the main board 120 can be supported at the opening periphery 120d by using a support member of a simple structure. In addition, in the receiver 10, by providing the support member 162 that supports part of the opening periphery 120d of the main board 120, the area of the surface 120b of the main board 120 covered by the support member can be reduced. Thereby, in the receiver 10, a larger number of electronic parts and the like can be mounted on the surface 120b of the main board 120.

In the first and second embodiments, the support members 160, 161 and 162 and the plate member 170 may be connected together by a screw or the like. Alternatively, the support member and the plate member 170 may be integral. By thus connecting the support member and the plate member or making them integral, the support member can be prevented from being shifted in the direction parallel to the main board 120, so that the opening periphery 120d can be supported more reliably.

Third Embodiment

Next, a third embodiment will be described with reference to FIG. 11. In the present embodiment, a board 700 is used as the plate member 170 that supports the support member 160. Since the structures of the present embodiment other than the structures associated with the board 700 are similar to those of the first and second embodiments, descriptions thereof are omitted.

Figure 11:
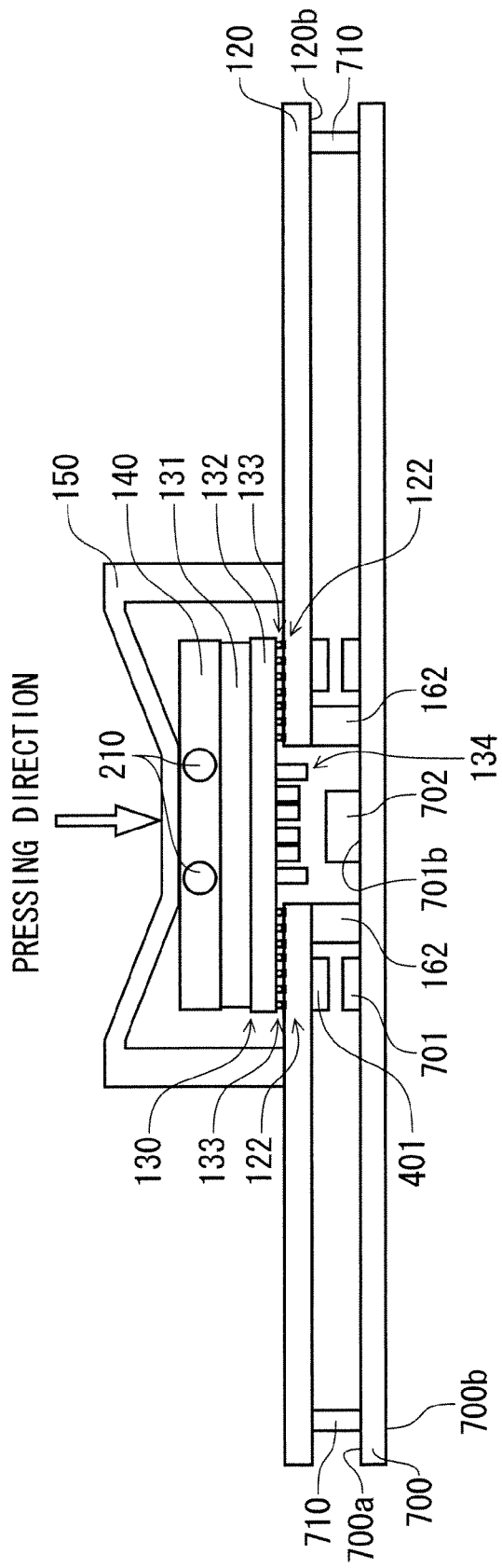
FIG. 11 illustrates a longitudinal cross section of a mounting structure according to a third embodiment.

FIG. 11 illustrates a longitudinal cross section of a mounting structure according to the third embodiment.

The circuit board 700 has a surface 700a, an opening-faced surface 700b, an electronic part 701 and an electronic part 702, and is attached to the main board 120 through a connection member 710.

The surface 700a is faced to the main board 120, and the opening-faced surface 700b is a part of the surface 700a faced to the opening 120c of the main board 120. The electronic part 701 is mounted on the surface 700a, and the electronic part 702 is mounted on the surface 700b.

By using the support member 161, 162 or the like as the support member that supports the opening 120c of the main board 120, as in FIG. 11, the electronic part 702 can be mounted on the opening-faced surface 700b faced to the opening 120c.

The circuit board 700 is not necessarily attached to the main board 120 but may be attached, for example, to the cabinet 20. By thus attaching the circuit board 700 to the cabinet 20, the surface 120b of the main board 120 can be prevented from being covered by the connection member 710, so that a larger number of electronic parts and the like can be mounted on the surface 120b.

According to the present embodiment, in the receiver 10, when the board 700 is faced to the surface 120b of the main board 120, by disposing a support member between the circuit board 700 and the main board 120, the support member can be made to abut on the main board 120 without the provision of a plate member such as a back plate. Further, in the receiver 10, by using a support member that supports the main board 120 at part of the opening periphery 120d, the area of the surface 700a of the circuit board 700 covered by the support member can be reduced, so that a larger number of electronic parts and the like can be mounted on the surface 700a.

The present invention is not limited to the above-described embodiments, but may be embodied with a constituent element being modified within the scope of the present invention. Moreover, various inventions may be created by appropriately combining plural constituent elements disclosed in the above-described embodiments. For example, several constituent elements may be deleted from all the constituent elements disclosed in the embodiments, or constituent elements of different embodiments may be combined as appropriate.

According to the above-described embodiments, in a circuit board having an opening or the like therein, a bend around the opening can be suppressed.

What is claimed is:

1. An electronic device, comprising:
a first circuit board in which an opening is formed;
a heating element including (i) a first surface on which a plurality of connection terminals are provided, the connection terminals being electrically connected with the first circuit board at a periphery of the opening, and (ii) a second surface;
an electronic part provided on the first surface so as to be surrounded by the connection terminals;
a heat receiving member thermally connected with the heating element from a side of the second surface;
a pressing member pressing the heat receiving member toward the first circuit board; and
a reinforcement member being in contact with the periphery of the opening so as to cover the opening from a side opposite to the heating element.

2. The device of claim 1,
wherein the reinforcement member supports a part of the periphery of the opening.

3. The device of claim 1,
wherein the reinforcement member is in contact with the first circuit board at the periphery of the opening and at an inner circumferential surface of the opening of the first circuit board.

4. The device of claim 1, further comprising:
a plate member attached to the first circuit board,
wherein the reinforcement member is positioned between the first circuit board and the plate member.

5. The device of claim 1, further comprising:
a second circuit board faced to the first circuit board, a second electronic part being mounted on the second circuit board, and
wherein the reinforcement member is in contact with the first circuit board and the second circuit board.

6. The device of claim 5,
wherein the second electronic part is mounted on the second circuit board at a surface thereof faced to the first circuit board, and
wherein the reinforcement member supports the first circuit board at a part of the periphery of the opening.

7. An electronic device, comprising:
a circuit board in which an opening is formed;
a heating element including a first surface on which a plurality of connection terminals are provided, the connection terminals being electrically connected with the circuit board at a periphery of the opening;
an electronic part provided on the one surface so as to be surrounded by the connection terminals;
a pressing member pressing the heating element toward the circuit board through a heat receiving member; and
a reinforcement member being in contact with the periphery of the opening from a side opposite to the heating element.

* * * * *